(12) United States Patent
Mizuno et al.

(10) Patent No.: US 7,764,471 B2
(45) Date of Patent: Jul. 27, 2010

(54) MAGNETO-RESISTANCE EFFECT ELEMENT HAVING DIFFUSION BLOCKING LAYER AND THIN-FILM MAGNETIC HEAD

(75) Inventors: Tomohito Mizuno, Tokyo (JP); Takahiko Machita, Tokyo (JP); Kei Hirata, Tokyo (JP); Yoshihiro Tsuchiya, Tokyo (JP); Shinji Hara, Tokyo (JP)

(73) Assignee: TDK Corporation, Tokyo (JP)

( * ) Notice: Subject to any disclaimer, the term of this patent is extended or adjusted under 35 U.S.C. 154(b) by 650 days.

(21) Appl. No.: 11/685,021

(22) Filed: Mar. 12, 2007

(65) Prior Publication Data

US 2008/0226948 A1 Sep. 18, 2008

(51) Int. Cl.
*G11B 5/33* (2006.01)
(52) U.S. Cl. .............. 360/324.11; 360/324; 360/324.1
(58) Field of Classification Search ............ 360/119.09, 360/324.11
See application file for complete search history.

(56) References Cited

U.S. PATENT DOCUMENTS

| | | | | |
|---|---|---|---|---|
| 6,773,515 | B2* | 8/2004 | Li et al. ...................... | 148/240 |
| 7,593,195 | B2* | 9/2009 | Fukuzawa et al. ........ | 360/324.1 |
| 2001/0036046 | A1* | 11/2001 | Mizuguchi ............. | 360/324.11 |
| 2002/0048128 | A1* | 4/2002 | Kamiguchi et al. ...... | 360/324.1 |
| 2003/0011945 | A1* | 1/2003 | Yuasa et al. ............. | 360/324.1 |
| 2004/0021990 | A1* | 2/2004 | Koui et al. ............... | 360/324.1 |
| 2004/0057162 | A1* | 3/2004 | Gill ........................... | 360/314 |
| 2004/0075956 | A1* | 4/2004 | Tetsukawa et al. ....... | 360/324.1 |
| 2004/0160810 | A1* | 8/2004 | Deak et al. .................. | 365/158 |
| 2005/0105221 | A1* | 5/2005 | Mizuguchi ............... | 360/324.1 |
| 2005/0135004 | A1* | 6/2005 | Lee et al. .................. | 360/122 |
| 2005/0201020 | A1* | 9/2005 | Fuke et al. ............... | 360/324.1 |
| 2006/0067011 | A1* | 3/2006 | Soda et al. ............... | 360/324.1 |
| 2009/0059443 | A1* | 3/2009 | Tsuchiya et al. .......... | 360/324.2 |

FOREIGN PATENT DOCUMENTS

| | | |
|---|---|---|
| JP | 2001-237471 A | 8/2001 |
| JP | 2003-218428 A | 7/2003 |
| JP | 2005-19484 A | 1/2005 |

* cited by examiner

*Primary Examiner*—William J Klimowicz
*Assistant Examiner*—Carlos E Garcia
(74) *Attorney, Agent, or Firm*—Knobbe Martens Olson & Bear LLP

(57) ABSTRACT

A magnetoresistance effect element (MR element) for use in a thin-film magnetic head has a buffer layer, an antiferromagnetic layer, a pinned layer, a spacer layer, a free layer, and a cap layer that are successively stacked. A sense current flows in a direction perpendicular to layer surfaces via a lower shield layer and an upper shield layer. The pinned layer comprises an outer layer having a fixed magnetization direction, a nonmagnetic intermediate layer, and an inner layer in the form of a ferromagnetic layer. The spacer layer comprises a first nonmagnetic metal layer, a semiconductor layer made of ZnO, and a second nonmagnetic metal layer. The inner layer or the outer layer includes a diffusion blocking layer made of an oxide of an element whose electronegativity is equal to or smaller than Zn, e.g., ZnO, TaO, ZrO, MgO, TiO, or HfO, or made of RuO.

9 Claims, 11 Drawing Sheets

MAGNETO-RESISTANCE EFFECT ELEMENT HAVING DIFFUSION BLOCKING LAYER AND THIN-FILM MAGNETIC HEAD

BACKGROUND OF THE INVENTION

1. Field of the Invention

The present invention relates to a magneto-resistance effect element and a thin-film magnetic head.

2. Description of the Related Art

Magnetic disk drives employ a thin-film magnetic head having a magneto-resistance effect element (MR element) for reading magnetic signals. In recent years, efforts have been made to design magnetic disk drives for higher recording densities, and accordingly there are growing demands for thin-film magnetic heads, particularly magneto-resistance effect elements, which satisfy higher-sensitivity and higher-output requirements.

A CIP-GMR (Current in Plane—Giant Magnetoresistance) element which is a giant magneto-resistance effect element having a nonmagnetic layer between ferromagnetic layers and passing a sensing current in parallel to a layer surface, has been conventionally developed as a reproducing element in a thin-film magnetic head. On the other hand, a magnetic head that uses a TMR (Tunnel Magneto-resistance) element which has an insulation layer instead of the nonmagnetic layer as an intermediate layer and which passes a sensing current perpendicular to a layer surface, has also been developed in order to achieve higher densification. Furthermore, a magnetic head that uses a CPP (Current Perpendicular to Plane)-GMR element which is a GMR element having a nonmagnetic layer as the intermediate layer and passing a sensing current perpendicular to the layer surface similar to the TMR element, has also been developed. CPP-GMR element has an advantage of having low resistance in comparison with the TMR element and having higher output in a narrower track width than the CIP-GMR element.

An ordinary GMR element is in the cylindrical shape of a desired size, and has a structure interposing a non-magnetic spacer layer between a pinned layer which is a ferromagnetic layer in which the magnetization direction is fixed and a free layer which is a ferromagnetic layer in which the magnetization direction varies according to an external magnetic field. Such a GMR element is also referred to as a spin valve film (SV film). The upper and lower ends of the GMR element are provided with a cap layer and a buffer layer, respectively. The cap layer, the GMR element, and the buffer layer are interposed between the upper shield layer and the lower shield layer. In the case of the CPP-GMR element, the upper shield layer and the lower shield layer function as an electrode, respectively, and a sense current flows in a direction orthogonal to the layer surface.

The spacer layer of a conventional CPP-GMR element has been most commonly comprised of Cu that is about 3.0 nm in thickness. However, in the CPP-GMR element having a spacer layer comprising Cu, since Cu has a low resistance, the sheet resistance (RA value) is low, and, for example, it is 0.07 $\Omega \cdot \mu m^2$, and the MR ratio is also low, and it is below about 4%. In this CPP-GMR element, to obtain a sufficient output voltage, it has been necessary to operate the element at a high current density. When the element is operated at the high current density, an electro-migration phenomenon occurs in which a metallic atom colliding with an electron migrates, and there is a fear that the magneto-resistance effect element will be destroyed by the migration of the atom and its life span becomes extremely short. Further, when the element is operated at the high current density, an output noise caused by a spin transfer torque occurs, and a practical problem arises.

To increase the RA value of the CPP-GMR element, a confined-current-path type magneto-resistance effect element has been proposed, in which a non-current portion is provided inside the spacer layer and the current is allowed to flow in a direction vertical to the layer surface by passing through only certain portions inside the spacer layer. In the confined-current-path type magneto-resistance effect element, the resistance of the spacer layer can be substantially high, thereby the RA value can be high. However, such a confined-current-path type magneto-resistance effect element has been difficult to manufacture, and it was extremely difficult to form the element at a high dimensional accuracy so as to be able to obtain desired performance.

Structures that have been proposed to increase the RA value of a CPP-GMR element without the confined-current-path technique include a structure wherein the spacer layer is made of three layers, i.e., a first interface layer, an electrically conductive layer, and a second interface layer, and a structure wherein a resistance adjusting layer is provided adjacent to the spacer layer. These proposed structures which have a substantial multilayer structure as the spacer layer have their MR ratio higher to some degree than a spacer layer in the form of a single Cu layer. However, though many materials may be used as the materials that makes up each layer of the spacer layer, specific materials that are best for increasing the MR ratio have not been proposed in the art.

A so-called synthetic pinned layer, which does not have a single-layer structure made of a ferromagnetic material, but has a multilayer structure including a nonmagnetic metal layer interposed between a plurality of ferromagnetic layers, has been employed as the pinned layer. The synthetic pinned layer gives strong exchange coupling between the two ferromagnetic layers to effectively increase the exchange coupling force from the antiferromagnetic layer.

Japanese Patent Laid-Open No. 2005-19484 discloses a pinned layer that has a five-layer structure comprising a first ferromagnetic layer, an anti-parallel coupling layer, a second ferromagnetic layer, a high polarizability layer, and an intermediate ferromagnetic fixed layer. Specifically, the first and second ferromagnetic layers and the intermediate ferromagnetic fixed layer are made of CoFe, the anti-parallel coupling layer is made of Ru, and the high polarizability layer is made of a Heusler alloy such as CoMnGe.

Japanese Patent Laid-Open No. 2003-218428 discloses a pinned layer that has a five-layer structure comprising a first magnetic layer comprising three magnetic layers, a nonmagnetic intermediate layer, and a second magnetic layer. Specifically, the second magnetic layer is made of CoFe, the nonmagnetic intermediate layer is made of Ru, the central layer of the first magnetic layer is made of a half metal such as a Heusler alloy, and the upper and lower layers of the first magnetic layer are made of CoFe.

FIGS. 11A through 13 of Japanese Patent Laid-Open No. 2001-237471 disclose a pinned layer that has a five-layer structure comprising a first metal magnetic layer, a nonmagnetic layer, a second metal magnetic layer, an oxide magnetic layer, and a third magnetic layer. Specifically, the first through third metal magnetic layers are made of CoFe, the nonmagnetic layer is made of Ru, and the oxide magnetic layer is made of Co—Fe—O.

SUMMARY OF THE INVENTION

It is an object of the present invention to provide a magnetoresistance effect element which is capable of achieving a high MR ratio and good element characteristics, and a thin-film magnetic head including such a magnetoresistance effect element.

A magnetoresistance effect element comprises:
a pinned layer having a fixed magnetization direction;
a free layer having a magnetization direction that is variable depending on an external magnetic field; and
a nonmagnetic spacer layer disposed between said pinned layer and said free layer;
the nonmagnetic spacer layer comprising a first nonmagnetic metal layer, a second nonmagnetic metal layer, and a semiconductor layer made of ZnO disposed between the first nonmagnetic metal layer and the second nonmagnetic metal layer;
the pinned layer including a diffusion blocking layer made of an oxide of an element whose electronegativity is equal to or smaller than Zn.

The diffusion blocking layer included in the pinned layer may be made of ZnO, TaO, ZrO, MgO, TiO, HfO, or RuO. These material notations do not represent any specific relative proportions. For example, TaO includes $Ta_2O_3$, and ZrO includes $ZrO_2$.

With the above structure, since the semiconductor layer is included in the spacer layer, the resistance can be increased without a reduction in the MR ratio, so that the magnetoresistance effect element can produce a large output voltage with a low current density. The diffusion blocking layer included in the pinned layer is made of an oxide of an element whose electronegativity is equal to or smaller than Zn, e.g., ZnO, TaO, ZrO, MgO, TiO, or HfO, or is made of RuO. The diffusion blocking layer is capable of attracting and holding a substance, e.g., Mn, in a layer held in contact with the pinned layer for thereby preventing the substance from being diffused into the semiconductor layer in the spacer layer. As a result, the temperature at which the magnetoresistance effect element is heat-treated can be increased to achieve a good exchange coupling of the pinned layer, and at the same time a high MR ratio can be obtained by the action of the semiconductor layer in the spacer layer.

The semiconductor layer is made of a semiconductor which is a substance whose band gap, i.e., the energy difference between the valence band and the conductive band, is in the range between 0.4 eV and 4.0 eV.

The diffusion blocking layer has a thickness equal to or greater than 0.195 nm and smaller than 0.7 nm. If the thickness of the diffusion blocking layer is smaller than 0.195 nm, then an oxide film, e.g., a ZnO film, as the diffusion blocking layer cannot be formed. If the thickness of the diffusion blocking layer is greater than 0.7 nm, then the exchange coupling tends to be broken.

The pinned layer comprises an outer layer, a nonmagnetic intermediate layer held in contact with the outer layer, and an inner layer having a surface held in contact with the nonmagnetic intermediate layer and another surface held in contact with the spacer layer. The outer layer, the nonmagnetic intermediate layer, and the inner layer are successively stacked. The diffusion blocking layer may be provided as part of the outer layer. The diffusion blocking layer may be provided as part of the inner layer. For reliably blocking a substance, e.g., Mn, from being diffused from another layer into the semiconductor layer in the pinned layer, it is effective to place the diffusion blocking layer in the outer layer remote from the spacer layer, rather than in the inner layer close to the spacer layer. The diffusion blocking layer may be placed in both the inner layer and the outer layer.

The magnetoresistance effect element may also have an antiferromagnetic layer including Mn, and the pinned layer may be deposited on the antiferromagnetic layer. The diffusion blocking layer blocks the diffusion of Mn included in the antiferromagnetic layer.

The above and other objects, features, and advantages of the present invention will become apparent from the following description with reference to the accompanying drawings which illustrate embodiments of the present invention.

DETAILED DESCRIPTION OF THE PREFERRED EMBODIMENTS

Embodiments of the present invention will be described below with reference to the drawings.

[Configuration of Thin-Film Magnetic Head]

Figure 1:
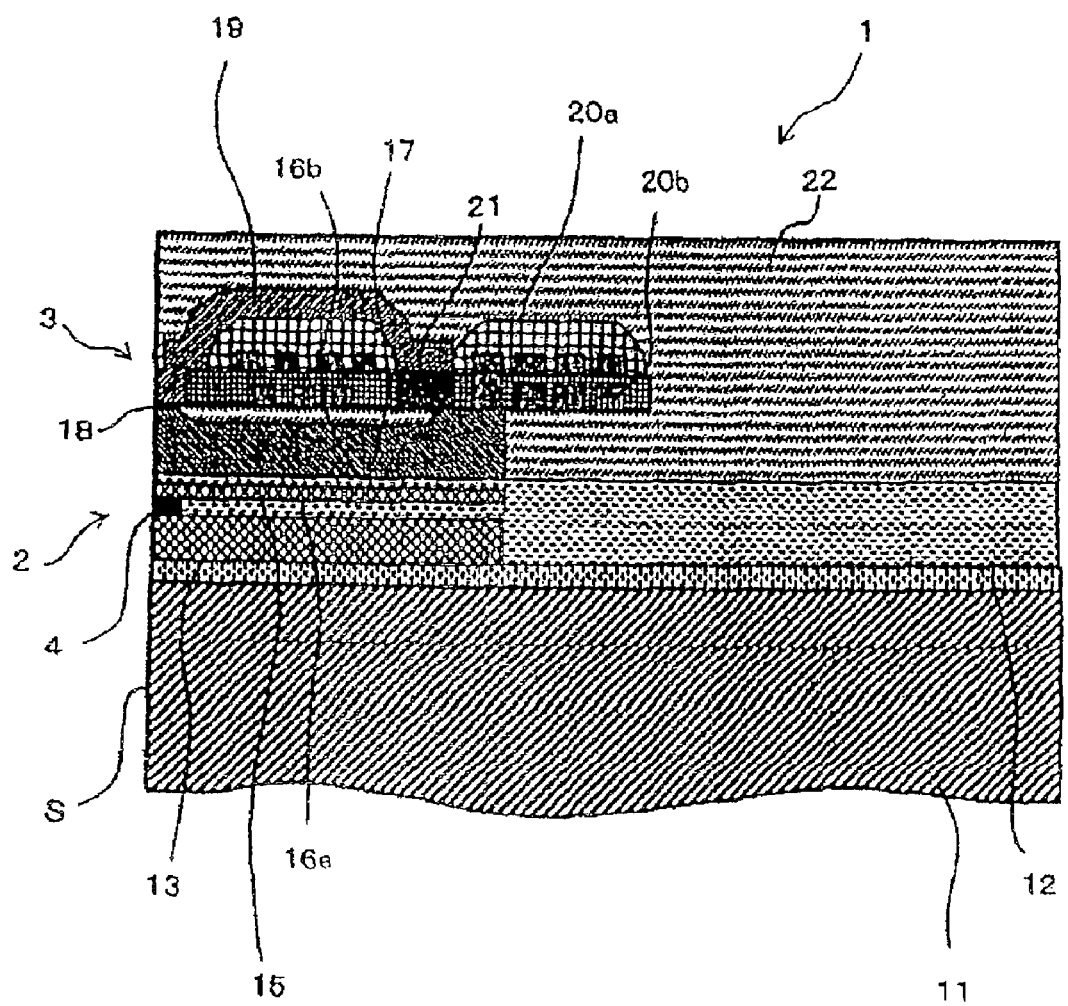
FIG. 1 is a cross-sectional view of a major portion of a thin-film magnetic head according to an embodiment of the present invention.

FIG. 1 conceptually shows a cross-sectional view of a major portion of a thin-film magnetic head having a magneto-resistance effect element according to the present invention.

Thin-film magnetic head 1 according to the present embodiment has substrate 11, reproducing unit 2 which reads data from a recording medium (not shown) and which is formed on substrate 11, and recording unit 3 for writing data on a recording medium (not shown) and which is formed on substrate 11.

Substrate 11 is made of $Al_2O_3$—TiC (AlTiC) that has excellent wear resistance. Base layer 12 made of alumina is disposed on an upper surface of substrate 11, and reproducing unit 2 and recording unit 3 are stacked on base layer 12.

Lower shield layer 13 made of a magnetic material such as Permalloy (NiFe), for example, is disposed on base layer 12. CPP-GMR element 4 which is a magneto-resistance effect element. (hereinafter, simply referred to as "MR element") is disposed on lower shield layer 13 at an end thereof near surface S (FIG. 11) and has an end exposed on surface S to face a recording medium. First upper shield layer 15 made of a magnetic material such as Permalloy, for example, is disposed on MR element 4. Lower shield layer 13, MR element 4, and first upper shield layer 15 jointly make up reproducing unit 2. Insulating layer 16a is primarily disposed in a region between lower shield layer 13 and first upper shield layer 15 which is without MR element 4. MR element 4 is also referred to as an SV film (spin valve film).

Lower magnetic pole layer 17 made of a magnetic material such as Permalloy or CoNiFe is disposed on first upper shield layer 15 with insulating layer 16b interposed therebetween. Lower magnetic pole layer 17 functions as a lower magnetic pole layer of recording unit 3 and also as a second upper shield layer of MR element 4.

Upper magnetic pole layer 19 is disposed on lower magnetic pole layer 17 which functions as a second upper shield layer, with recording gap layer 18 interposed therebetween, which is made of a nonmagnetic material such as Ru or alumina. Recording gap layer 18 is disposed on lower magnetic pole layer 17 at an end thereof near surface S to face a recording medium and has an end exposed on surface S to face a recording medium. Upper magnetic pole layer 19 is made of a magnetic material such as Permalloy or CoNiFe. Lower magnetic pole layer (second upper shield layer) 17 and upper magnetic pole layer 19 are magnetically connected to each other by connector 21, and they make up a magnetic circuit as a whole.

Coils 20a, 20b made of an electrically conductive material such as copper are disposed as two layers between lower magnetic pole layer 17 and upper magnetic pole layer 19 and also between surface S to face a recording medium and connector 21. Each of coils 20a, 20b serves to supply magnetic fluxes to lower magnetic pole layer 17 and upper magnetic pole layer 19 and has a planar spiral shape surrounding connector 21. Coils 20a, 20b are insulated from the surrounding region by an insulating layer. Though coils 20a, 20b in the two layers are illustrated in this embodiment, they are not limited to the two layers, but may be in one layer or three or more layers.

Overcoat layer 22 is disposed in covering relation to upper magnetic pole layer 19, and protects the structure described above. Overcoat layer 22 is made of an insulating material such as alumina, for example.

[Configuration of MR Element]

Figure 2:
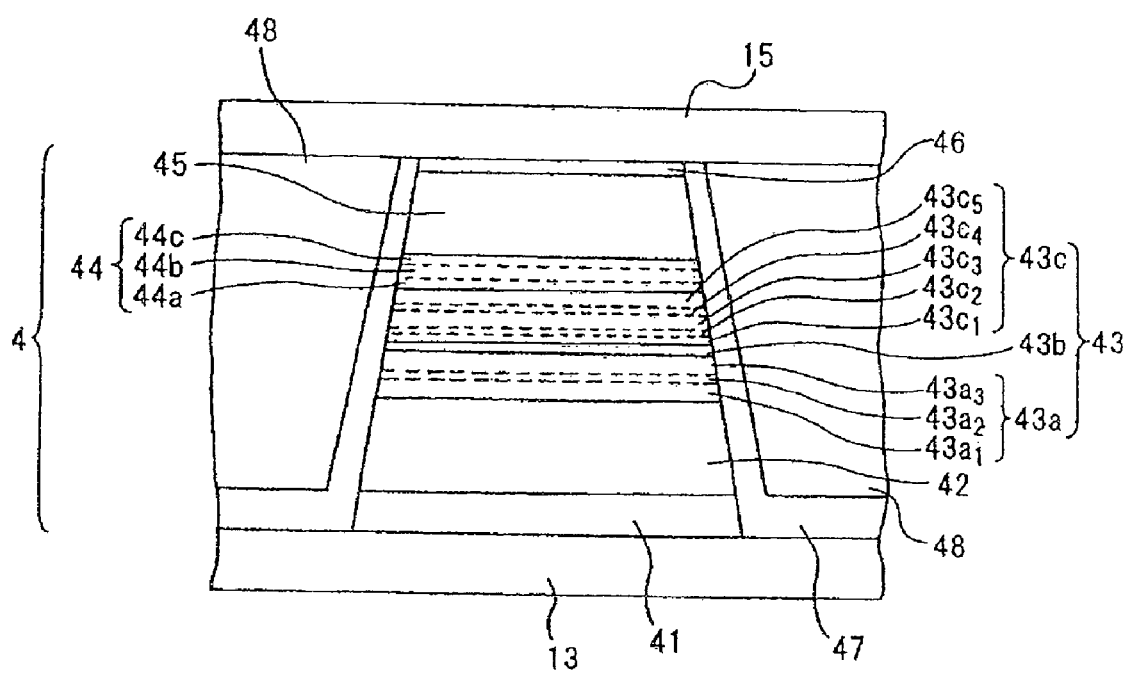
FIG. 2 is a view of an MR element shown in FIG. 1 as viewed from its surface to face a recording medium.

Next, MR element 4 (SV film) will be described in detail below with reference to FIG. 2, which is a view of MR element 4 as viewed from surface S to face a recording medium.

As described above, MR element 4 is interposed between lower shield layer 13 and upper shield layer 15. MR element 4 has a structure comprising buffer layer 41, antiferromagnetic layer 42, pinned layer 43, spacer layer 44, free layer 45, and cap layer 46 which are stacked successively in this order from the side of lower shield layer 13. In the embodiment shown in FIG. 2, Pinned layer 43 has a structure wherein nonmagnetic intermediate layer 43b is interposed between outer layer 43a and inner layer 43c each made of a ferromagnetic material. Pinned layer 43 having such a structure is referred to as a synthetic pinned layer. Outer layer 43a is held in contact with antiferromagnetic layer 42, and inner layer 43c is held in contact with spacer layer 44. Lower shield layer 13 and upper shield layer 15 serve as electrodes, respectively. A sense current flows in a direction orthogonal to the layer surface through lower shield layer 13 and upper shield layer 15 of MR element 4. Lower shield layer 13 and upper shield layer 15 comprise NiFe films having a thickness of about 2 µm or less.

One example of materials and thicknesses of the respective layers of MR element 4 is shown in Table 1.

TABLE 1

| | | material | thickness(nm) |
|---|---|---|---|
| | Cap layer | Ru | 10 |
| | Free layer | CoFe/NiFe/CoFe/Cu/CoFe/NiFe/CoFe | 1/2/0.5/0.2/0.5/2/1 |
| spacer layer | Nonmagnetic metal layer | Cu | 0.2~2.0 |
| | Semiconductor layer | ZnO | 1.0~3.0 |
| | Nonmagnetic metal layer | Cu | 0.2~2.0 |
| pinned layer | inner layer | CoFe/ZnO/CoFe/Cu/CoFe | 1/0.2~0.6/1.3/0.2/1.3 |
| | Nonmagnetic intermediate layer | Ru | 0.4 or 0.8 |
| | outer layer | CoFe/ZnO/CoFe | 1.5/0.2~0.6/1.5 |
| | Antiferromagnetic layer | IrMn | 7 |
| | Buffer layer | Ta/NiCr | 1/2 |

A combination of materials in which exchange coupling between anti-ferromagnetic layer 42 and outer layer 43a of pinned layer 43 becomes favorable is selected as a material of buffer layer 41. Buffer layer 41 comprises a laminated layer of Ta having a thickness of 1 nm and NiCr having a thickness of 2 nm. Incidentally, in the present specification, "/" showing a multi-layer structure means that the layer of the left side of "/" is a layer lower than the layer of the right side, that is, a layer formed earlier.

Anti-ferromagnetic layer 42 plays a role of fixing the magnetization direction of pinned layer 43, and for example, comprises a film such as IrMn film that has a thickness of 7.0 nm.

Pinned layer 43 is formed as a magnetic layer, and, as described above, has a structure wherein outer layer 43a, nonmagnetic intermediate layer 43b, and inner layer 43c are stacked in the order named. Outer layer 43a has its magnetization direction fixed with respect to an external magnetic field by antiferromagnetic layer 42. Outer layer 43a has a three-layer structure comprising, for example, 70CoFe film $43a_1$ having a thickness of 1.5 nm, ZnO film $43a_2$ having a thickness ranging from 0.2 nm to 0.6 nm, and 70CoFe film $43a_3$ having a thickness of 1.5 nm. Nonmagnetic intermediate layer 43b comprises an Ru film having a thickness of 0.4 nm or 0.8 nm, for example. Inner layer 43c is a ferromagnetic layer which has a five-layer structure comprising, for example, 90CoFe film $43c_1$ having a thickness of 1.0 nm, ZnO film $43c_2$ having a thickness ranging from 0.2 nm to 0.6 nm, 30CoFe film $43c_3$ having a thickness of 1.3 nm, Cu film $43c_4$ having a thickness of 0.2 nm, and 30CoFe film $43c_5$ having a thickness of 1.3 nm. In such a synthetic pinned layer, magnetic moments of outer layer 43a and inner layer 43c cancel each other to suppress an overall leaking magnetic field, and inner layer 43c has its magnetization direction fixed firmly. As described later, ZnO films $43a_2$, $43c_2$ disposed respectively in outer layer 43a and inner layer 43c each function as a diffusion blocking layer for blocking the diffusion of Mn in antiferromagnetic layer 42. The diffusion blocking layer is not limited to a ZnO film, but may be a film of an oxide of an element whose electronegativity is equal to or smaller than Zn, such as a TaO film, a ZrO film, an MgO film, a TiO film, or an HfO film, or may be an Ru film, for example. In the present embodiment, the diffusion blocking layer in the form of an ZnO film will be described below.

The diffusion blocking layer may be present in either outer layer 43a or inner layer 43c. If ZnO film $43a_2$ is included in outer layer 43a, then a Cu film may be provided in place of ZnO film $43c_2$ in inner layer 43c. If ZnO film $43c_2$ is included in inner layer 43c, then outer layer 43a may comprise a single layer of 70CoFe rather than including ZnO film $43a_2$ therein.

Spacer layer 44 has a three-layer structure comprising first nonmagnetic metal layer 44a, semiconductor layer 44b, and second nonmagnetic metal layer 44c. Each of first nonmagnetic metal layer 44a and second nonmagnetic metal layer 44c comprises a Cu film having a thickness ranging from 0.2 to 2.0 nm. Semiconductor layer 44b comprises a ZnO film having a thickness ranging from 1.0 to 3.0 nm. The operation and advantages of spacer layer 44 will be described later.

Free layer 45 has its magnetization direction variable depending on the external magnetic field. In the present embodiment, free layer 45 has a seven-layer structure comprising a 70CoFe film having a thickness of 1.0 nm, an 80NiFe film having a thickness of 2.0 nm, a 70CoFe film having a thickness of 0.5 nm, a Cu film having a thickness of 0.2 nm, a 70CoFe film having a thickness of 0.5 nm, an 80NiFe film having a thickness of 2.0 nm, and a 70CoFe film having a thickness of 1.0 nm.

Cap layer 46 is provided to prevent deterioration of MR element 4, and is made of Ru having a thickness of 10.0 nm, for example.

Hard bias films 48 are disposed on opposite sides (right and left sides in FIG. 2) of MR element 4 in a track width direction (an in-plane direction of each of the layers of MR element 4 within a plane parallel to surface S to face a recording medium (see FIG. 1)), with insulating films 47 interposed therebetween. Hard bias films 48 apply a biasing magnetic field in the track width direction to free layer 45 to turn free layer 45 into a single magnetic domain. Hard bias films 48 are made of a hard magnetic material such as CoPt, CoCrPt, or the like, for example. Insulating films 47 serve to prevent the sensing current from leaking into hard bias films 48, and may be in the form of an oxide film of $Al_2O_3$, for example. Insulating films 47 may be a part of insulating layer 16a.

[Configuration and Operation Effect of Spacer Layer and Pinned Layer]

Spacer layer 44 and pinned layer 43, which represent the most characteristic structures of the present embodiment, will be described below.

First, the background to the achievement of the present invention will be described below. The inventor of the present invention attempted to improve the MR ratio by employing spacer layer 44 of a multilayer structure, rather than a single-layer structure of Cu. The inventor found that it is particularly effective to provide spacer layer 44 having a structure wherein semiconductor layer 44b is interposed between first nonmagnetic metal layer 44a and second nonmagnetic metal layer 44c. Specifically, first nonmagnetic metal layer 44a and second nonmagnetic metal layer 44c are made of Cu, which is the material of the conventional single spacer layer and semiconductor layer 44b is made of ZnO (this arrangement will be referred to as "reference example" for the sake of convenience). Pinned layer 43 comprises, as with the conventional arrangement, outer layer 43a in the form of a single layer of CoFe, nonmagnetic intermediate layer 43b in the form of a single layer of Ru, and inner layer 43c having a five-layer structure comprising layers of CoFe, Cu, CoFe, Cu, and CoFe.

According to the reference example, since spacer layer 44 includes semiconductor layer 44b, it is considered that information about the direction of a spin can be transmitted from pinned layer 43 to free layer 45 without any loss. Furthermore, since spacer layer 44 includes semiconductor layer 44b, the resistance value is large, and the magnetoresistance effect element can produce a large output voltage and a low current density.

However, the arrangement of the reference example may fail to achieve a sufficiently high MR ratio. The inventor has analyzed causes of the failure and has found that the MR ratio varies greatly depending on the temperature of the heat treatment (annealing). Specifically, the inventor has found the tendency for the MR ratio to be greatly reduced as the temperature of the heat treatment on MR element 4 rises (see FIG. 3A).

Figure 3A:
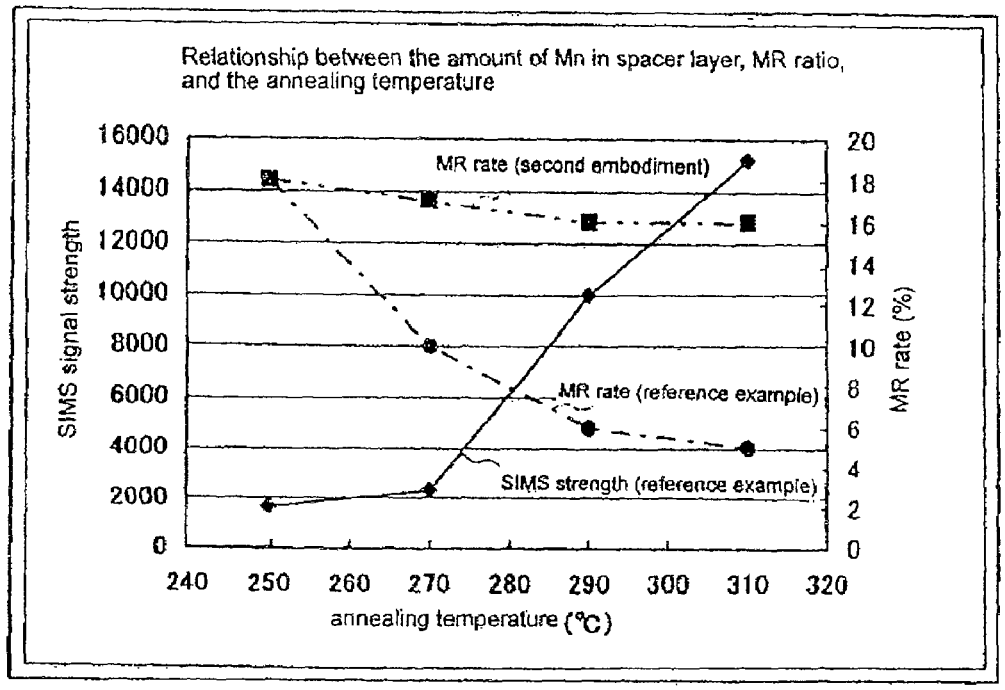
FIG. 3A is a graph showing the relationship of the SIMS signal strength of Mn and MR ratio in an MR element which has a spacer layer having a semiconductor layer including ZnO and a pinned layer without a diffusion blocking layer, and the MR ratio in an MR element which has a pinned layer including a diffusion blocking layer, with respect to the temperature at which the MR elements were heat-treated.
Figure 3B:
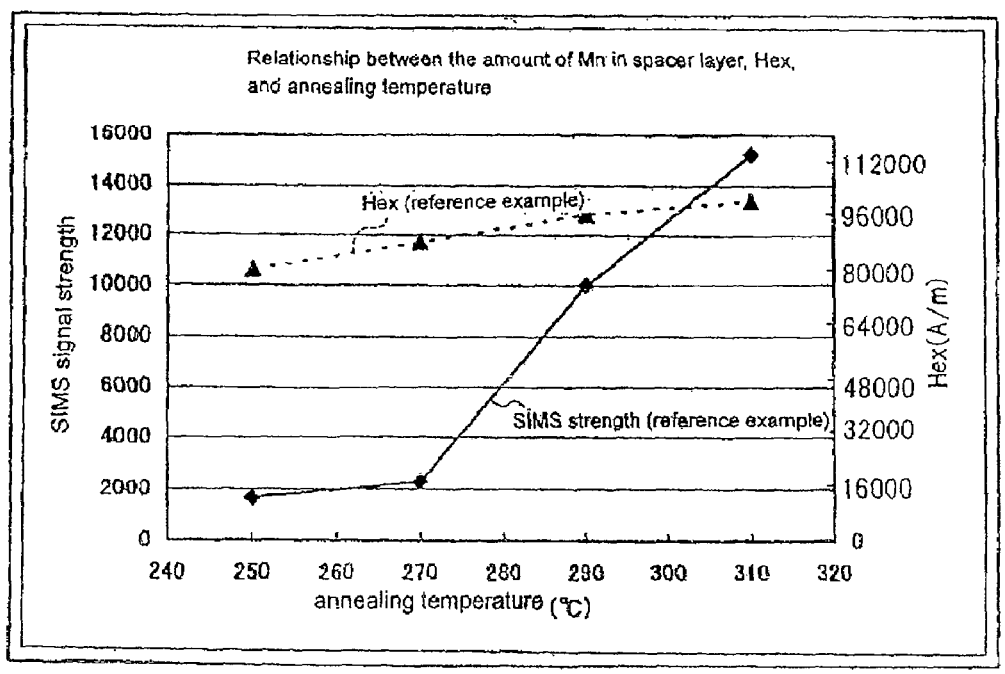
FIG. 3B is a graph showing the relationship of the SIMS signal strength of Mn and exchange coupling magnetic field in an MR element which has a spacer layer having a semiconductor layer including ZnO and a pinned layer without a diffusion blocking layer, with respect to the temperature at which the MR element was heat-treated.
Figure 4:
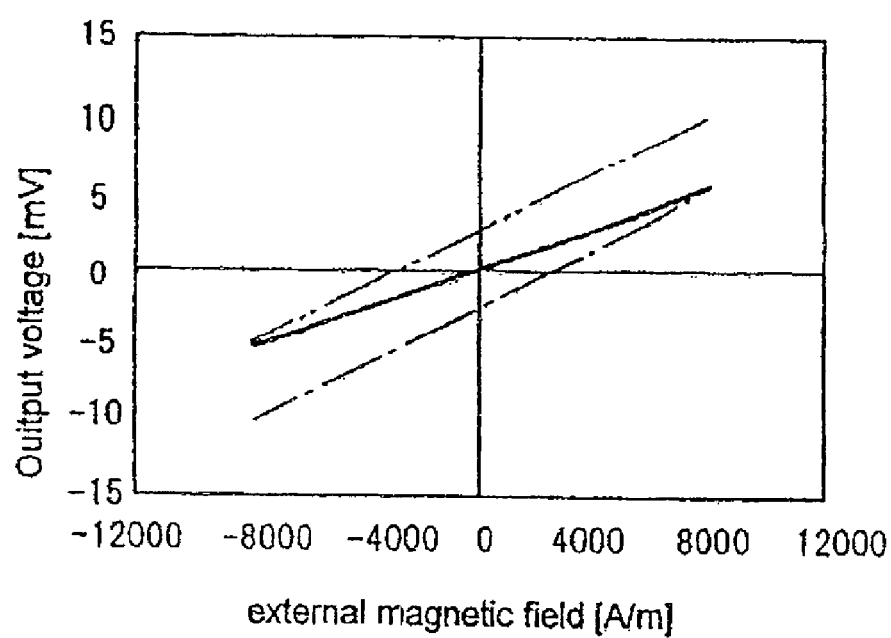
FIG. 4 is a graph showing the relationship between the external magnetic field and the output voltage, the graph being illustrative of waveform symmetry which is one of the characteristics of an MR element.

The heat treatment is performed for the purpose of providing an exchanging coupling between pinned layer 43 and antiferromagnetic layer 42. As shown in FIG. 3B, as the temperature of the heat treatment increases, the exchange coupling magnetic field Hex increases. If the exchange coupling magnetic field Hex decreases, then problems arise in that element characteristics such as waveform symmetry and SN ratio are degraded. The waveform symmetry refers to an accurate proportionality relationship from the point of origin, between the external magnetic field due to the recording medium or the like and the output voltage of MR element 4, as shown in FIG. 4. Specifically, the waveform symmetry represents that, when the external magnetic field is 0 A/m, the output voltage is 0 mV, when a positive magnetic field is applied, a positive output voltage is produced, and when a negative magnetic field is applied, a negative output voltage is produced (see the solid-line curve A in FIG. 4). If the waveform symmetry is poor (see the dot-and-dash-line curve and the two-dot-and-dash-line curve in FIG. 4, for example), a thin-film magnetic head incorporating MR element 4 fails to provide the desired reading performance.

An analysis of the failure to obtain the desired MR ratio because of the high temperature of the heat treatment indicates that the failure is considered to result from the diffusion of Mn in antiferromagnetic layer 42 into semiconductor layer 44b in spacer layer 44. Specifically, ZnO in semiconductor layer 44b attracts Mn in antiferromagnetic layer 42, and is mixed with Mn. ZnO that is mixed with Mn loses the properties of a semiconductor, and its function to transmit information about the direction of a spin without a loss is also lost. FIGS. 3A and 3B show the signal strength representing the amount of the element Mn in semiconductor layer 44b of MR element 4 as determined by SIMS (Secondary Ion Mass Spectrometry) method. It can be seen from FIGS. 3A and 3B that when the temperature of the heat treatment is 270° C. or higher, the signal strength is greatly increased, the amount of Mn in semiconductor layer 44b is greatly increased, and the MR ratio is greatly reduced.

Figure 5A:
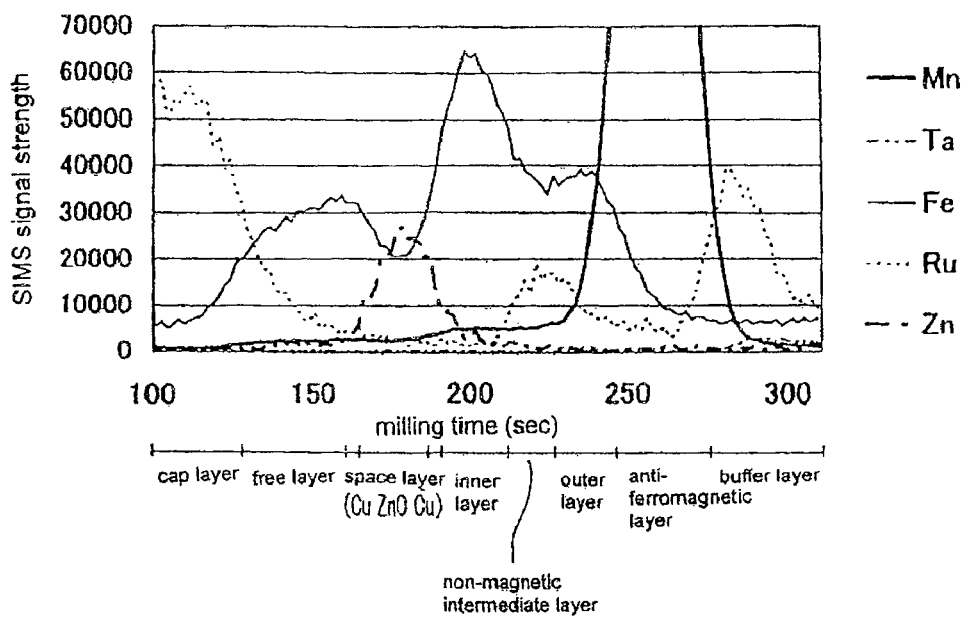
FIG. 5A is a graph showing the relationship between the SIMS signal strength of each element and the milling time when an MR element, which has a spacer layer having a semiconductor layer including ZnO and a pinned layer without a diffusion blocking layer, was heat-treated at 270° C.
Figure 5B:
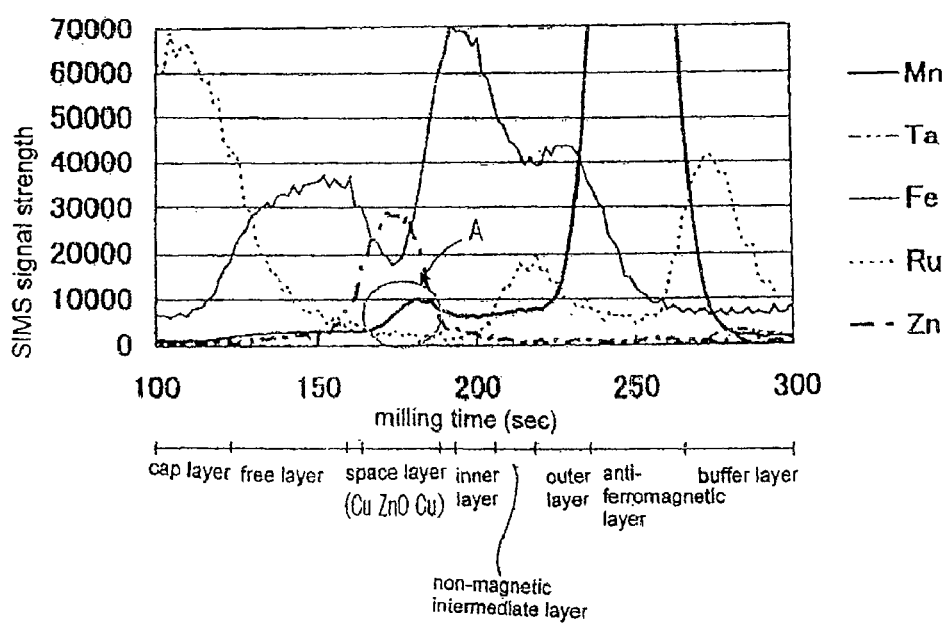
FIG. 5B is a graph showing the relationship between the SIMS signal strength of each element and the milling time when an MR element, which has a spacer layer having a semiconductor layer including ZnO and a pinned layer without a diffusion blocking layer, was heat-treated at 290° C.

FIGS. 5A and 5B are graphs showing amounts of the elements Mn, Ta, Fe, Ru, and Zn in each layer according to the reference example. Strictly, the data shown in FIGS. 5A and 5B indicate the relationship between the milling time and the signal strength of each of the elements based on the SIMS method. Since milling acts from above, i.e., from cap layer 46, the milling time is essentially proportional to the distance from the upper region of MR element 4. The milling time, which is represented by the horizontal axis of FIG. 5, is essentially representative of the distance from the upper region of MR element 4. If the horizontal axis is divided into suitable ranges, then these ranges can be regarded as representing the respective layers of MR element 4. Though these ranges may not strictly be accurately defined, they are roughly indicative of the respective layers of MR element 4 along the horizontal axis. The maximum values of the signal strength of Mn are not shown in the graphs due to space limitations. However, the maximum value of the signal strength of Mn in FIG. 5A is about 147700 (milling time: about 250 seconds), and the maximum value of the signal strength of Mn in FIG. 5B is about 157700 (milling time: about 250 seconds).

FIG. 5A shows the SIMS signal strength of the elements Mn, Ta, Fe, Ru, and Zn in each layer of MR element 4 which has been heat-treated at 270° C. The SIMS signal strength represents the amounts of the elements. A study of FIG. 5A indicates that a large amount of Mn is present in antiferromagnetic layer 42 of IrMn and Zn is present in semiconductor layer 44b in spacer layer 44. According to the graph shown in FIG. 5A, only a slight amount of Mn is present in semiconductor layer 44b in spacer layer 44 to such an extent that it will not affect the function of ZnO as a semiconductor.

FIG. 5B shows the SIMS signal strength of the elements Mn, Ta, Fe, Ru, and Zn in each layer of MR element 4 which has been heat-treated at 290° C. The SIMS signal strength represents the amounts of the elements. A study of FIG. 5B indicates that a relatively large amount of Mn and Zn is present in semiconductor layer 44b in spacer layer 44 (see encircled area A). The Mn adversely affects the function of ZnO as a semiconductor and reduces the effect provided by semiconductor layer 44b included in spacer layer 44.

FIGS. 5A and 5B verify the fact that Mn in semiconductor layer 44b increases as the temperature of the heat treatment increases as shown in FIG. 3A. It is presumed that the increased Mn is responsible for the reduction in the MR ratio. If the temperature of the heat treatment is lowered, then the exchange coupling magnetic field Hex decreases, resulting in a reduction in the element characteristics such as waveform symmetry, as described above (see FIG. 3B).

The inventor has studied to look for a structure which does not cause a reduction in the MR ratio even if the temperature of the heat treatment is increased to about 290° C. As a result, the inventor has found that it is effective to provide a film of an oxide of an element whose electronegativity is equal to or smaller than Zn, e.g., a ZnO film, a TaO film, a ZrO film, an MgO film, a TiO film, or an HfO film, or to provide an RuO film, in pinned layer 45. The present invention has been completed in this manner.

Specifically, spacer layer 44 includes semiconductor layer 44b in the form of a ZnO film interposed between first nonmagnetic metal layer 44a and second nonmagnetic metal layer 44b each in the form of a Cu film, and outer layer 43a or inner layer 43c or both outer layer 43a and inner layer 43c of pinned layer 45 include a diffusion blocking layer having a thickness ranging from about 0.2 nm to 0.6 nm.

Figure 6:
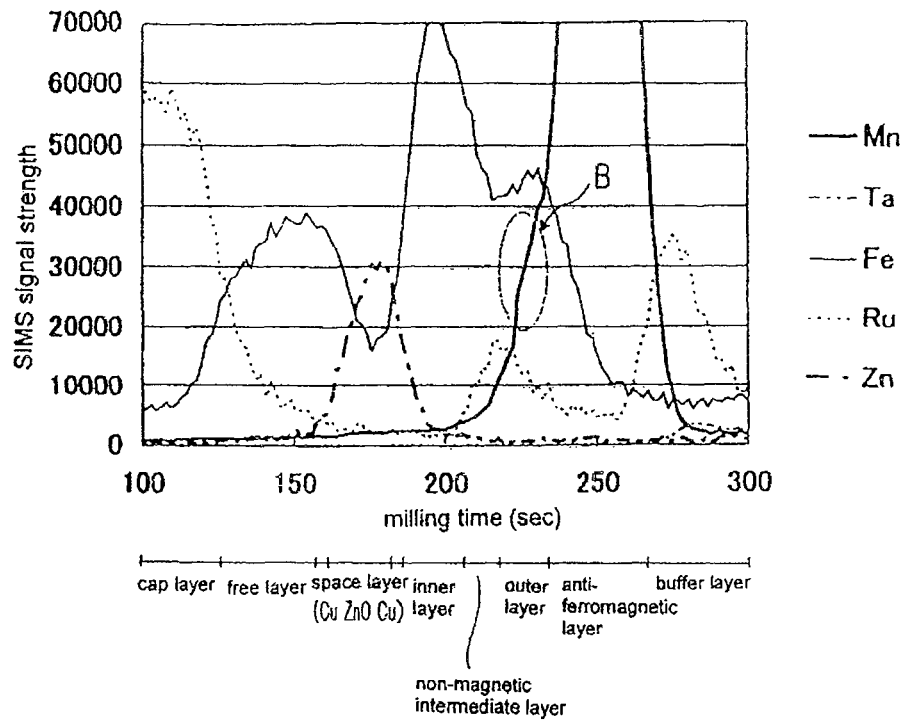
FIG. 6 is a graph showing the relationship between the SIMS signal strength of each element and the milling time when an MR element, which has a spacer layer having a semiconductor layer including ZnO and a pinned layer having an outer layer including a ZnO film, was heat-treated at 290° C.

First, MR element 4 including outer layer 43a of a three-layer structure which comprises 70CoFe film $43a_1$ having a thickness of 1.5 nm, ZnO film $43a_2$ having a thickness of 0.4 nm, and 70CoFe film $43a_3$ having a thickness of 1.5 nm, and inner layer 43c of a five-layer structure which comprises 90CoFe film $43c_1$ having a thickness of 1.0 nm, Cu film $43c_2$ having a thickness of 0.2 nm, 30CoFe film $43c_3$ having a thickness of 1.3 nm, Cu film $43c_4$ having a thickness of 0.2 nm, and 30CoFe Film $43c_5$ having a thickness of 1.3 nm, was fabricated, and then heat-treated at 290° C. MR element 4 thus produced is referred to as a first embodiment, and the amounts of the elements Mn, Ta, Fe, Ru, and Zn in MR element 4 according to the first embodiment are shown in FIG. 6. The data shown in FIG. 6 indicate the signal strength of each of the elements based on the SIMS method, as with FIGS. 5A and 5B. The maximum value of the signal strength of Mn is not shown in the graph due to space limitations. However, the maximum value of the signal strength of Mn in FIG. 6 is about 164100 (milling time: about 252 seconds).

The first embodiment, and second through fourth embodiments to be described later, are essentially identical in structure to conventional MR element 4, except for spacer layer 44 and pinned layer 43, and will not be described in detail below.

Figure 7:
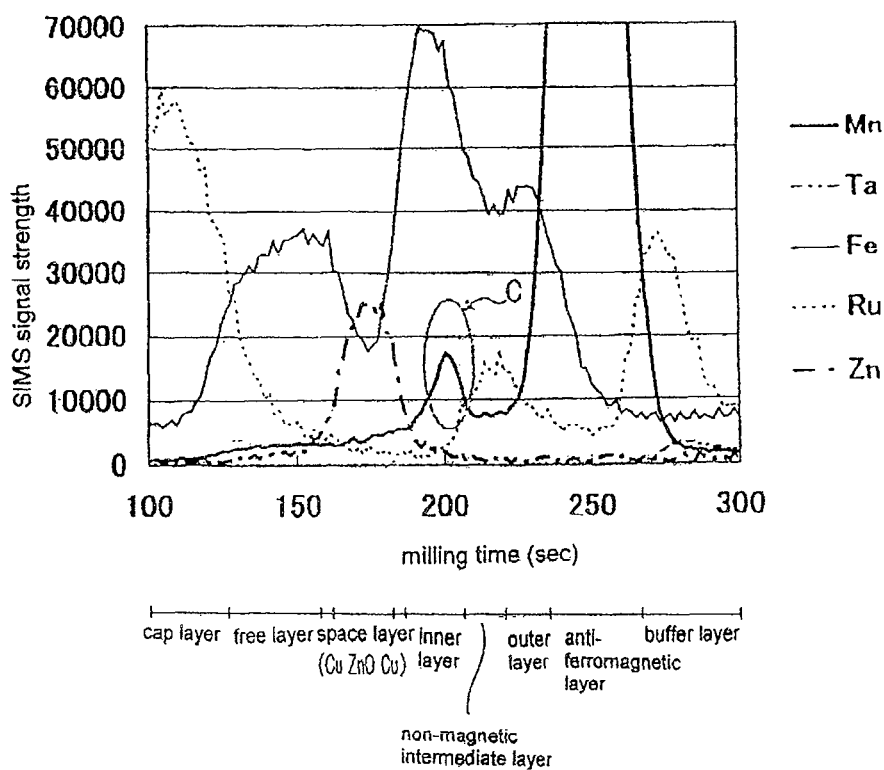
FIG. 7 is a graph showing the relationship between the SIMS signal strength of each element and the milling time when an MR element, which has a spacer layer having a semiconductor layer including ZnO and a pinned layer having an inner layer including a ZnO film, was heat-treated at 290° C.

A comparison of FIG. 6 and FIG. 5B shows that almost no Mn is present in spacer layer 44 and the amount of Mn in pinned layer 43 is increased (see encircled area B). Though it is somewhat difficult to see from the graph shown in FIG. 6, since the waveform of the signal strength of Mn is not symmetric with respect to the maximum value, the increase in the amount of Mn in outer layer 43a can be seen. This is considered to result from Mn in antiferromagnetic layer 42 attracted by and diffused into ZnO film $43a_2$ in outer layer 43a. Since the Mn diffused from antiferromagnetic layer 42 is attracted by ZnO film $43a_2$ in outer layer 43a and stays in outer layer 43a, the Mn is prevented from moving beyond outer layer 43a to semiconductor layer 44b in spacer layer 44. Therefore, ZnO in semiconductor layer 44b in spacer layer 44 does not lose its function as a semiconductor, and contributes to an increase in the MR ratio. Then, MR element 4 including outer layer 43a of a single-layer structure which comprises a 70CoFe film having a thickness of 3.7 nm, and inner layer 43c of a five-layer structure which comprises 90CoFe film $43c_1$ having a thickness of 1.0 nm, ZnO film $43c_2$ having a thickness of 0.4 nm, 30CoFe film $43c_3$ having a thickness of 1.3 nm, Cu film $43c_4$ having a thickness of 0.2 nm, and 30CoFe Film $43c_5$ having a thickness of 1.3 nm, was fabricated, and then heat-treated at 290° C. MR element 4 thus produced will be referred to as a second embodiment. The amounts of the elements Mn, Ta, Fe, Ru, and Zn in MR element 4 according to the second embodiment are shown in FIG. 7. The data shown in FIG. 7 indicate the signal strength of each of the elements based on the SIMS method, as with FIGS. 5A and 5B. The maximum value of the signal strength of Mn is not shown in the graph due to space limitations. However, the maximum value of the signal strength of Mn in FIG. 7 is about 156100 (milling time: about 253 seconds).

A comparison of FIG. 7 and FIG. 5B shows that almost no Mn is present in spacer layer 44 and the amount of Mn in pinned layer 43 is increased (see encircled area C). This is considered to result from Mn in antiferromagnetic layer 42 attracted by and diffused into ZnO film $43c_2$ in inner layer 43c. Since the Mn diffused from antiferromagnetic layer 42 is attracted by ZnO film $43c_2$ in inner layer 43c and stays in inner layer 43c, the Mn is prevented from moving beyond inner layer 43c to semiconductor layer 44b in spacer layer 44. Therefore, ZnO in semiconductor layer 44b in spacer layer 44 does not lose its function as a semiconductor, and contributes to an increase in the MR ratio.

As can be seen from the first and second embodiments shown in FIGS. 6 and 7, since the ZnO film is provided as the diffusion blocking layer in pinned layer 43, ZnO in pinned layer 43 attracts and holds Mn in antiferromagnetic layer 42 and prevents Mn from being diffused into spacer layer 44 beyond pinned layer 43. Therefore, ZnO in semiconductor layer 44b in spacer layer 44 is not mixed with Mn and keeps its function as a semiconductor for transmitting information about the direction of a spin without any loss, and hence contributes to an increase in the MR ratio. FIG. 3A shows the MR ratio of the second embodiment, i.e., the MR ratio of MR element 4 whose inner layer 43c includes a ZnO film. Inasmuch as the temperature of the heat treatment can be set to a high temperature of about 290° C., the exchange coupling magnetic field Hex can be increased (see FIG. 3B), thereby improving the element characteristics such as the waveform symmetry and the SN ratio.

A comparison of FIGS. 6 and 7 reveals that the amount of Mn in spacer layer 44 is smaller in FIG. 6 than in FIG. 7. If ZnO film $43c_2$ is provided in inner layer 43c close to spacer layer 44 to attract Mn, then a slight amount Mn is present which goes to spacer layer 44 beyond inner layer 43c. Conversely, if ZnO film $43a_2$ is provided in outer layer 43a remote from spacer layer 44 to attract Mn, then since the distance up to spacer layer 44 is large with nonmagnetic intermediate layer 43b and inner layer 43c interposed, any amount of Mn which goes to spacer layer 44 through these layers 43b, 43c is considered to be small.

Although not shown, a structure according to a third embodiment may include ZnO film $43c_2$ provided as a diffusion blocking layer in inner layer 43c and ZnO film $43a_2$ provided as a diffusion blocking layer in outer layer 43a (see Table 1). These diffusion blocking layers are expected to further reduce the amount of Mn diffused into semiconductor layer 44b in spacer layer 44.

The thickness of ZnO film $43c_2$ in inner layer 43c and/or ZnO film $43a_2$ in outer layer 43 will be described below.

Figure 8:
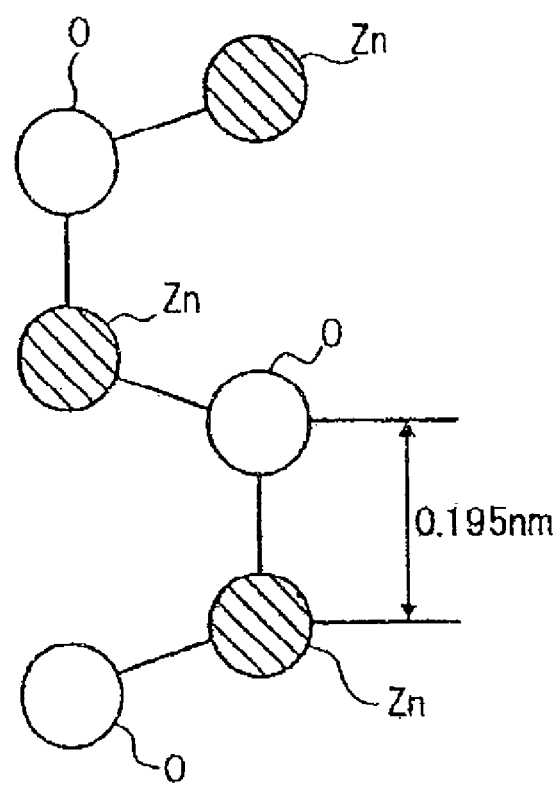
FIG. 8 is a schematic view showing a ZnO layer structure.

FIG. 8 shows a ZnO layer structure. According to the ZnO layer structure, at least one layer of Zn and one layer of 0 are required to provide ZnO. Since the interval between the layer of Zn and the layer of 0 is 0.195 nm, a film thickness of at least 0.195 nm is necessary for a ZnO film. Furthermore, in view of manufacturing process considerations, each of ZnO film $43a_2$ and ZnO film $43c_2$ should preferably have a thickness of at least 0.2 nm.

Figure 9:
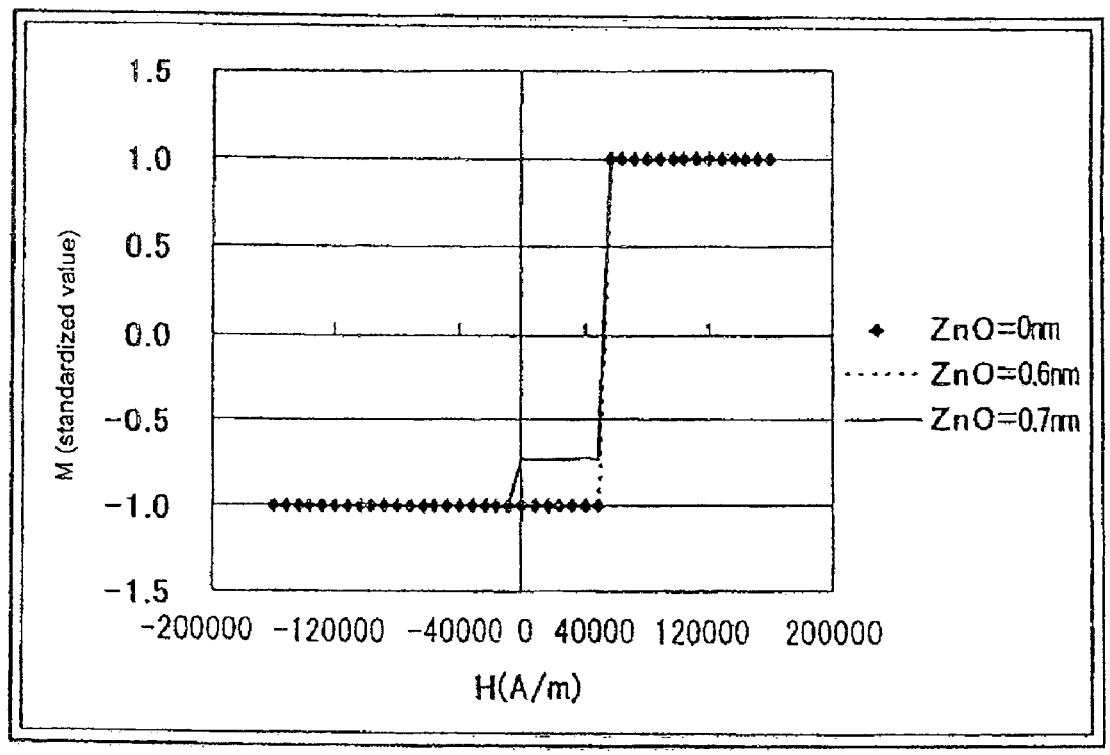
FIG. 9 is a graph showing a magnetization curve of an MR element, the graph being illustrative of an exchange coupling state.

If the thickness of ZnO film $43c_2$ in inner layer 43c and/or ZnO film $43a_2$ in outer layer 43a increases, then the exchange coupling between pinned layer 43 and antiferromagnetic layer 42 tends to be broken. Specifically, as described above, ZnO films $43a_2$, $43c_2$ in pinned layer 43 are provided for the purpose of blocking the diffusion of Mn from antiferromagnetic layer 42, and do not contribute to the exchange coupling. If ZnO films $43a_2$, $43c_2$ which do not contribute to the exchange coupling are too thick, then the strength of the exchange coupling may possibly be reduced. FIG. 9 shows a magnetization curve of MR element 4. A magnetization curve of an MR element wherein no diffusion blocking layer is present in pinned layer 43 (ZnO: 0 nm) is regarded as representing an ordinary exchange coupling state. The MR element according to the first embodiment wherein ZnO film $43a_2$ is provided in outer layer 43a (ZnO: 0.6 nm) has a magnetization curve which is substantially the same as the magnetization curve representing the ordinary exchange coupling state. However, a magnetization curve of an MR element, wherein the ZnO film in pinned layer 43 is too thick (ZnO: 0.7 nm), indicates that the magnetization is partly interrupted in the vicinity of 0 A/m, thereby breaking the exchange coupling. In this case, a component is produced wherein the magnetization is directed toward the external magnetic field.

It is concluded from the above analysis that the thickness of ZnO film $43c_2$ in inner layer 43c and/or ZnO film $43a_2$ in outer layer 43a should preferably be equal to or greater than 0.195 nm and should preferably be smaller than 0.7 nm.

In the first through third embodiments described above, the ZnO film is provided as the diffusion blocking layer in inner layer 43c and/or outer layer 43a. However, a TaO film, a ZrO film, an MgO film, a TiO film, or an Hf film may be used instead of the ZnO film as the diffusion blocking layer. The diffusion blocking layer which is made of a film of an oxide of an element whose electronegativity is equal to or smaller than Zn also operates in the same manner and offers the same advantages as the ZnO film described above. The reason for this is that, since an element whose electronegativity is equal to or smaller than Zn of semiconductor layer 44b in spacer layer 44 is unlikely to produce a pair of shared electrons with oxygen molecules, Mn diffused from antiferromagnetic layer 43 forms a covalent bond with oxygen, rather than an oxide of the element, and becomes stable. As a result, before Mn is diffused into semiconductor layer 44b in spacer layer 44, it is absorbed by the diffusion blocking layer. It has also been experimentally found that a diffusion blocking layer in the form of an RuO film whose electronegativity is greater than Zn offers the same advantages as described above.

[Head Gimbal Assembly and Hard-Disk Drive which Include Thin-Film Magnetic Head]

Figure 10:
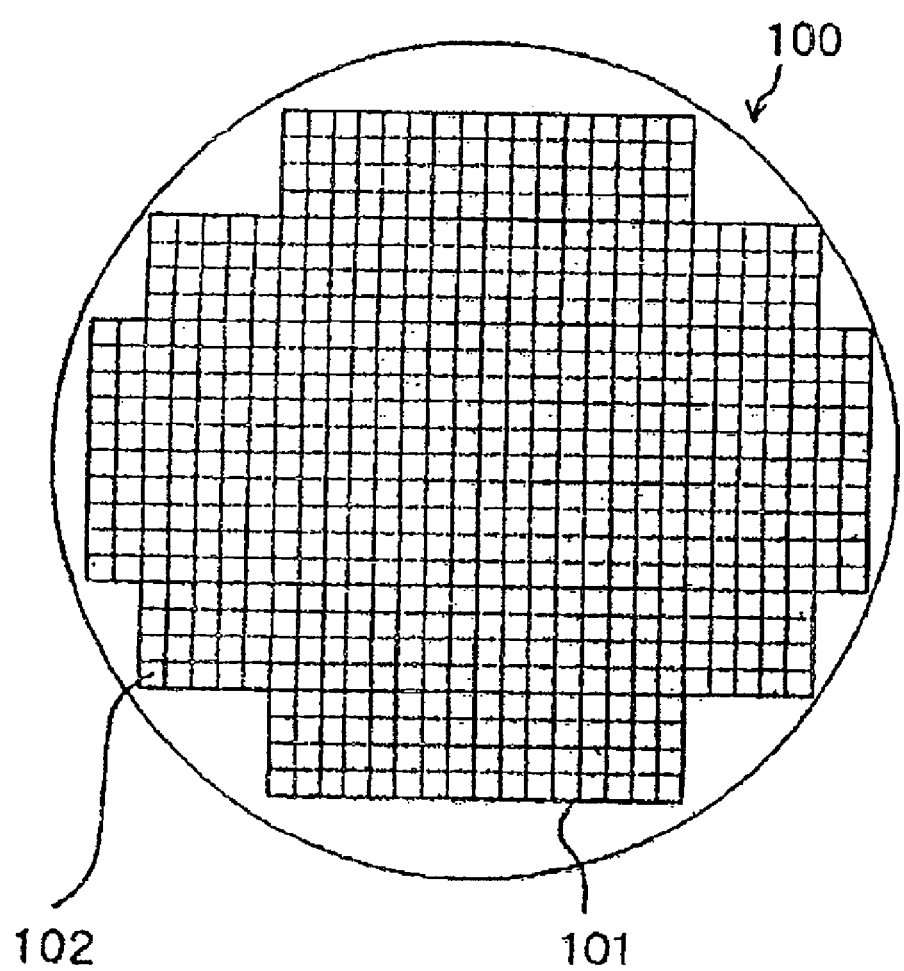
FIG. 10 is a plan view of one example of a wafer in which thin-film magnetic heads shown in FIG. 1 are formed.

Many thin-film magnetic heads 1 according to the present invention are formed in a single wafer. FIG. 10 shows a diagrammatic plan view of the wafer having many structures (substrates) that includes the thin-film magnetic head shown in FIG. 1 thereon.

Wafer 100 is divided into a plurality of head element aggregates 101 each including a plurality of head elements 102 each serving as a working unit for polishing surface S to face a recording medium of thin-film magnetic head 1 (see FIG. 1). Dicing portions (not shown) are provided between head element aggregates 101 and also provided between head elements 102. Head element 102 is a structure (substrate) including the structure of thin-film magnetic head 1, and becomes thin-film magnetic head 1 after having been subjected to necessary processing such as polishing to form surface S to face a recording medium. The polishing process is carried out generally on a plurality of head elements 102 which has been cut out into a row.

Figure 11:
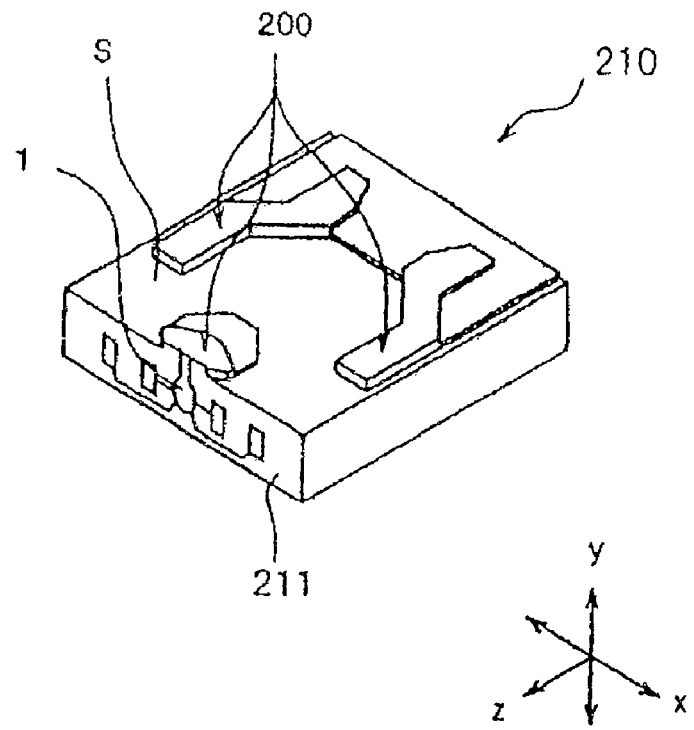
FIG. 11 is a perspective view of one example of a slider including the thin-film magnetic head shown in FIG. 1.

A head gimbal assembly and a hard disk drive having the thin-film magnetic head according to the present invention will be described below. First, slider 210 included in the head gimbal assembly will be described below with reference to FIG. 11. In the hard disk drive, slider 210 is arranged opposite to a hard disk, which is a rotationally-driven disc-shaped recording medium. Slider 210 has thin-film magnetic head 1 obtained from head element 102 (see FIG. 10). Slider 210 has a substantially hexahedral shape in which surface S to face a recording medium is formed into an air bearing surface 200 which is positioned opposite to the hard disk. When the hard disk rotates in z direction in FIG. 11, an air stream passing between the hard disk and slider 210 applies a lifting force to slider 210 downward in a y direction. Slider 210 is lifted from the surface of the hard disk by the lifting force. X directions in FIG. 11 represent a direction transverse to the tracks of the hard disk. At end surface 211 on the outlet side of the airflow of slider 210, are electrode pads to input or output signals to/from reproducing unit 2 and recording unit 3 (see FIG. 1). Surface 211 is the upper end face in FIG. 1.

Head gimbal assembly 220 will be described below with reference to FIG. 12. Head gimbal assembly 220 has slider 210 and suspension 221 by which slider 210 is resiliently supported Suspension 221 comprises load beam 222 in the form of a leaf spring made of stainless steel, for example, flexure 223 mounted on an end of load beam 222 for giving slider 210 an appropriate degree of freedom, slider 210 being joined to flexure 223, and base plate 224 mounted on the other end of load beam 222. Base plate 224 is mounted on arm 230 of an actuator for moving slider 210 in x directions transverse to the tracks of hard disk 262. The actuator has arm 230 and a voice-oil motor for moving arm 230. A gimbal for keeping slider 210 at a constant attitude is mounted on a portion of flexure 223 where slider 210 is installed.

Head gimbal assembly 220 is mounted on arm 230 of the actuator. A structure wherein head gimbal assembly 220 is mounted on single arm 230 is referred to as a head arm assembly. A structure wherein a carriage has a plurality of arms and head gimbal assembly 220 is mounted on each of the arms is referred to as a head stack assembly.

Figure 12:
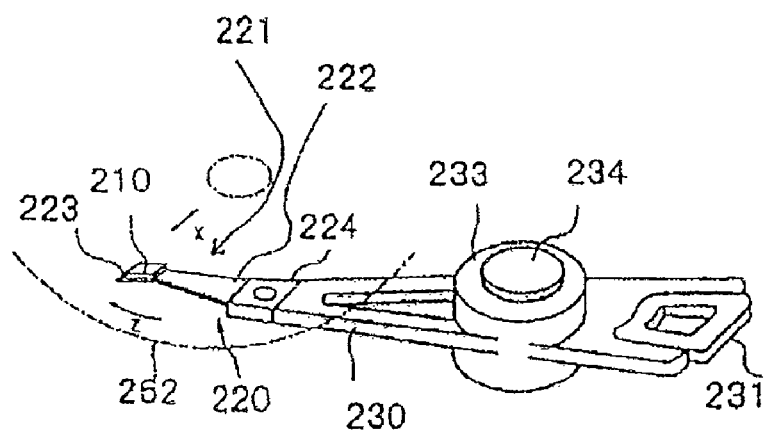
FIG. 12 is a perspective view of a head gimbal assembly including the slider shown in FIG. 11.

FIG. 12 shows a head arm assembly by way of example. In the head arm assembly, head gimbal assembly 220 is mounted on an end of arm 230. Coil 231 which is part of the voice-coil motor is mounted on the other end of arm 230. In the intermediate portion of arm 230, bearing 233 which is attached to shaft 234 for rotatably supporting arm 230 is provided.

Figure 13:
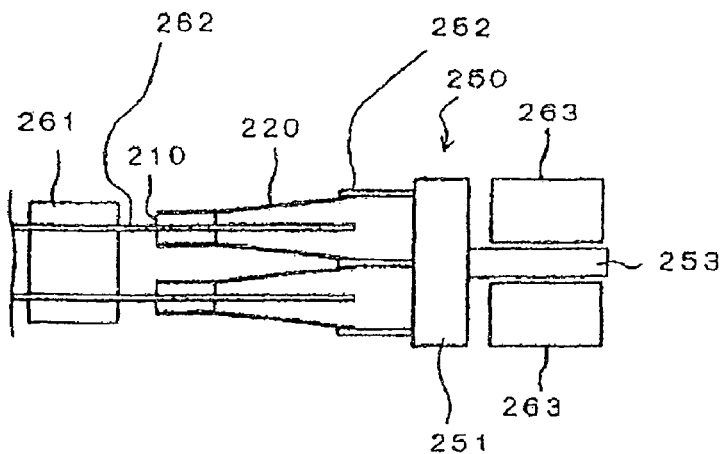
FIG. 13 is a side elevational view of a major portion of a hard disk drive including the head gimbal assembly shown in FIG. 12.
Figure 14:
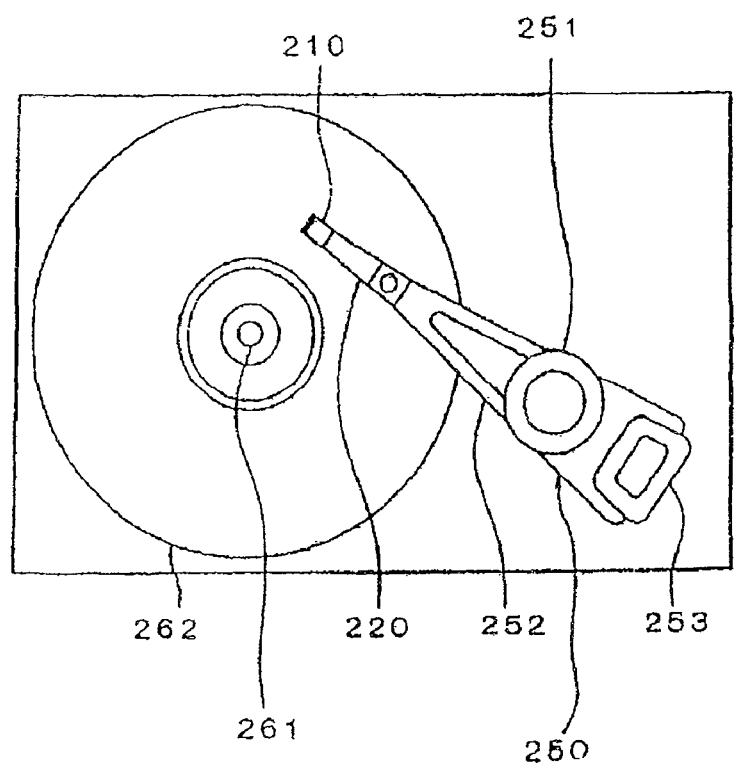
FIG. 14 is a plan view of the hard disk drive including the head gimbal assembly shown in FIG. 12.

A head stack assembly and a hard disk drive will be described below with reference to FIGS. 13 and 14. FIG. 13 is a view showing a major portion of a hard disk drive, and FIG. 14 is a plan view of the hard disk drive. Head stack assembly 250 has carriage 251 having a plurality of arms 252. A plurality of head gimbal assemblies 220 are attached to a plurality of arms 252 such that head gimbal assemblies 220 are arranged apart from each other in the vertical direction. Coil 253, which constitutes a part of the voice-coil motor, is attached to carriage 251 on the side opposite to arms 252. Head stack assembly 250 is installed in a hard disk drive. The hard disk drive has a plurality of hard disks (magnetic recording media) 262 mounted on spindle motor 261. Two sliders 210 are arranged at positions opposite to each other interposing hard disk 262 therebetween. The voice coil motor has permanent magnets 263 which are arranged in positions opposite to each other interposing coil 253 of head stack assembly 250 therebetween.

Head stack assembly 250, except sliders 210, and the actuator support sliders 210 and position sliders 210 with respect to hard disks 262.

In the hard disk drive, the actuator moves sliders 210 in directions transverse to the tracks of hard disks 262 and position sliders 210 with respect to hard disks 262. Thin-film magnetic heads 1 included in sliders 210 record information in hard disks 262 through recording unit 3, and reproduce information recorded in hard disks 262 through reproducing unit 2.

Thin-film magnetic head 1 is not limited to the above embodiments, but may be modified in various ways. For example, though thin-film magnetic head 1 that has a structure wherein reading MR element 4 is disposed near substrate 11 and writing induction-type electromagnetic transducer is stacked on MR element 4 has been described in the above embodiments, reading MR element 4 and the writing induction-type electromagnetic transducer may be switched around. Though a thin-film magnetic head having both an MR element and an induction-type electromagnetic transducer has been described in the above embodiments, a thin-film magnetic head may have only an MR element.

Although a certain preferred embodiment of the present invention has been shown and described in detail, it should be understood that various changes and modification may be made without departing from the spirit or scope of the appended claims.

What is claimed is:

1. A magnetoresistance effect element comprising:
    a pinned layer having a fixed magnetization direction;
    a free layer having a magnetization direction variable depending on an external magnetic field;
    a nonmagnetic spacer layer disposed between said pinned layer and said free layer; and
    an anti-ferromagnetic layer including IrMn for exchange coupling with said pinned layer, said pinned layer being stacked on said anti-ferromagnetic layer,
    said nonmagnetic spacer layer comprising a first nonmagnetic metal layer made of Cu, a second nonmagnetic metal layer made of Cu, and a semiconductor layer made of ZnO disposed between said first nonmagnetic metal layer and said second nonmagnetic metal layer;
    said pinned layer including a diffusion blocking layer made of ZnO which is an oxide of an element whose electronegativity is equal to or smaller than Zn so that ZnO of said diffusion blocking layer blocks the diffusion of Mn of said anti-ferromagnetic layer in order to improve the RA value.

2. A magnetoresistance effect element according to claim 1, wherein said diffusion blocking layer has a thickness equal to or greater than 0.195 nm and smaller than 0.7 nm.

3. A magnetoresistance effect element according to claim 1, wherein said pinned layer comprises an outer layer, a nonmagnetic intermediate layer held in contact with said outer layer, and an inner layer having a surface held in contact with said nonmagnetic intermediate layer and another surface held in contact with said spacer layer,
    said outer layer, said nonmagnetic intermediate layer, and said inner layer being successively stacked, and
    said diffusion blocking layer being provided as part of said outer layer.

4. A magnetoresistance effect element according to claim 1, wherein said pinned layer comprises an outer layer, a nonmagnetic intermediate layer held in contact with said outer layer, and an inner layer having a surface held in contact with said nonmagnetic intermediate layer and another surface held in contact with said spacer layer, said outer layer, said nonmagnetic intermediate layer, and said inner layer being successively stacked, and said diffusion blocking layer being provided as part of said inner layer.

5. A thin-film magnetic head having a magnetoresistance effect element according to claim 1.

6. A magnetoresistance effect element according to claim 1, wherein the semiconductor layer is constituted of a material having a band gap in which the energy difference between a valence band and conductive band is in a range between 0.4 eV and 4.0 eV.

7. A magnetoresistance effect element according to claim 1, wherein the pinned layer is a synthetic pinned layer in which a nonmagnetic intermediate layer is interposed between an outer layer and an inner layer made of a ferromagnetic material.

8. A magnetoresistance effect element according to claim 1, further comprising:

a cap layer;

an antiferromagnetic layer; and a buffer layer, wherein the buffer layer, the antiferromagnetic layer, the pinned layer, the spacer layer, the free layer, the cap layer are stacked in this order.

9. A magnetoresistance effect element according to claim 8, further comprising a hard bias film disposed on a side of the magnetoresistance effect element in a track width direction.

* * * * *